United States Patent
Caldera et al.

(10) Patent No.: US 8,223,793 B2
(45) Date of Patent: Jul. 17, 2012

(54) METHOD FOR TRANSMITTING LINE SIGNALS VIA A LINE DEVICE, AND TRANSMISSION APPARATUS

(75) Inventors: Peter Caldera, Villach (AT); Thomas Ferianz, Bodensdorf (AT)

(73) Assignee: Lantiq Deutschland GmbH, Neubiberg (DE)

( * ) Notice: Subject to any disclaimer, the term of this patent is extended or adjusted under 35 U.S.C. 154(b) by 875 days.

(21) Appl. No.: 11/146,300

(22) Filed: Jun. 6, 2005

(65) Prior Publication Data

US 2005/0286550 A1 Dec. 29, 2005

(30) Foreign Application Priority Data

Jun. 4, 2004 (DE) .................... 10 2004 027 367

(51) Int. Cl.
*H04L 12/66* (2006.01)
(52) U.S. Cl. ........................................ 370/463
(58) Field of Classification Search .......... 370/463; 379/387

See application file for complete search history.

(56) References Cited

U.S. PATENT DOCUMENTS

| 5,541,553 | A | * | 7/1996 | Chujo et al. | 330/51 |
|---|---|---|---|---|---|
| 6,704,181 | B2 | * | 3/2004 | Saksa | 361/64 |
| 6,710,603 | B2 | | 3/2004 | Gregorius | |
| 7,031,435 | B2 | * | 4/2006 | Andrews et al. | 379/1.01 |
| 7,058,170 | B2 | * | 6/2006 | Brocco et al. | 379/279 |
| 2002/0082725 | A1 | * | 6/2002 | Dute et al. | 700/51 |
| 2002/0118818 | A1 | * | 8/2002 | Miller et al. | 379/387.02 |
| 2002/0149894 | A1 | | 10/2002 | Gregorius | |
| 2003/0169872 | A1 | * | 9/2003 | Enriquez et al. | 379/387.01 |
| 2004/0169985 | A1 | | 9/2004 | Gropl | |
| 2007/0047729 | A1 | * | 3/2007 | Youngblood | 379/399.01 |

FOREIGN PATENT DOCUMENTS

| DE | 101 10 140 C1 | 2/2003 |
|---|---|---|
| DE | 102 41 354 A1 | 3/2004 |

OTHER PUBLICATIONS

STMicroelectronics,STLC-3080—Subscriber Line Interface Circuit, Jan. 2004.*

* cited by examiner

*Primary Examiner* — Derrick Ferris
*Assistant Examiner* — Christopher R Crompton
(74) *Attorney, Agent, or Firm* — SpryIP, LLC

(57) ABSTRACT

A transmission apparatus for line signals is provided having a line device for transmitting the line signals at prescribed signal levels and having a line driver device which has an amplifier unit and a control unit. A determination unit is used to change over the operating mode of the amplifier unit when a signal level for the line signals exceeds a prescribed reference level by virtue of a determination unit having established that a prescribed reference signal level has been exceeded by the signal level of the line signals.

12 Claims, 4 Drawing Sheets

METHOD FOR TRANSMITTING LINE SIGNALS VIA A LINE DEVICE, AND TRANSMISSION APPARATUS

FIELD OF THE INVENTION

The invention relates generally to line driver devices, which are also called subscriber line interface circuits (SLICs), and relates particularly to a transmission apparatus for line signals for transmitting the line signals at prescribed signal levels.

BACKGROUND

FIG. 4 shows a conventional line driver device LT for transmitting line signals via a transmission line L. The line driver device LT has an output stage AS which provides a prescribable level for the line signals which are to be driven. The output stage AS is controlled by an operating-mode control unit BS, with the output stage AS being able to be switched to different modes by the operating mode control unit BS. The operating mode control unit BS receives, via a mode control bus BUS, control signals for controlling line driver device LT on the basis of external parameters. To protect the conventional line driver device LT, normally external protective elements SE are used which are connected between the transmission line L and the output stage AS.

Such protective elements SE ensure that, by way of example, overvoltages (which can be caused by a lightning strike and/or contact with the mains, for example) do not impair or even destroy the output stage AS or the entire line driver LT. Such external protective elements SE are prescribed in line with international standards such as K.20, K.45 (ITU_T) or GR.1089 (ANSI).

Conventionally, the protection provided by the protective elements SE is brought about essentially by transistors, diodes or similar components. Disadvantageously, such protective elements are expensive and such a protective device using the protective elements is highly complex. It is also a drawback that the conventional external protective elements are of complicated design.

SUMMARY

It is therefore an object of the present invention to provide a line driver device which is reliably protected against excessively high signal levels on the line or on the line device, with complex design for external or protective elements being avoided.

This object is achieved by a transmission apparatus for line signals, and an associated method, having the features of embodiments of the invention.

Preferred embodiments of the invention use an available changeover option for an output stage in the form of an amplifier stage or amplifier unit in different operating modes in order to be able to select an operating mode in which the amplifier unit is insensitive toward excessive signal levels when such excessive signal levels arise. Embodiments of the invention provide a determination unit for determining when a prescribed reference signal level is exceeded by the signal level of the line signals and for outputting a control signal, the control signal being used to change over an operating mode for the amplifier unit.

If the amplifier unit is switched to an operating mode such that the amplifier unit to an increased signal level and, when such a level arises on the line device, is insensitive toward this increased signal level, then external protective devices can be dispensed with or are much simpler to design.

One particular expediency is that a conventional line driver device has a control unit for controlling the operating modes of the amplifier unit anyway. By providing the inventive determination unit, it is thus possible to change over the amplifier unit to different operating modes easily.

Advantageously, the determination unit contains a detection unit which detects excessively high signal levels for line signals. Expediently, overvoltages and/or overcurrents on the line devices are detected in this context.

The inventive transmission apparatus for line signals essentially has:
a) a line device for transmitting the line signals at prescribed signal levels; and
b) a line driver device having an amplifier unit for amplifying the line signals which are to be driven into the line device to the prescribed signal level and a control unit for controlling an operating mode for the amplifier unit using an operating-mode control signal which is output from the control unit, with a determination unit for determining when a prescribed reference signal level is exceeded by the signal level of the line signals and for outputting a control signal, which can be used to change over an operating mode for the amplifier unit, to the control unit being provided. Such changeover is preformed when a signal level for the line signals exceeds the prescribed signal reference level.

The inventive method for transmitting line signals via a transmission line also essentially has the following steps:
a) an operating mode for an amplifier unit is controlled using an operating-mode control signal which is output from a control unit;
b) the line signals to be transmitted are amplified to a prescribable signal level using an amplifier unit on the basis of the operating mode; and
c) the line signals to be transmitted are driven onto the line device, the signal level of the line signals being detected using a detection unit, the detected signal level of the line signals being compared with a prescribed reference signal level using a comparison unit, and a control signal being output from the comparison device on the basis of the comparison and being supplied to a control unit, with the amplifier unit being switched to a safety mode if the signal level of the line signals exceeds the prescribed reference signal level.

In line with one preferred development of the present invention, the determination unit has a detection unit for detecting the signal level of the line signals.

In line with a further preferred development of the present invention, the determination unit has a comparison unit for comparing the signal level of the line signals which has been detected by the detection unit with the prescribed reference signal level.

In line with yet another preferred development of the present invention, the detection unit is in the form of a potential-difference detection unit for detecting a potential difference which is present on the line device.

In line with yet another preferred development of the present invention, the detection unit is in the form of a current detection unit for detecting a current signal which corresponds to a current flowing in the line device.

In line with yet another preferred development of the present invention, the line driver device has a mode control bus for supplying an external mode control signal to the control unit. Expediently, it is possible to change over the operating mode of the amplifier unit using control signals supplied externally via the mode control bus.

In line with yet another preferred development of the present invention, the amplifier unit is turned off as the operating mode of the amplifier unit when a signal level for the line signals exceeds the prescribed reference signal level.

In line with yet another preferred development of the present invention, the prescribed reference signal level is provided as a reference potential difference.

In line with yet another preferred development of the present invention, the prescribed reference signal level is provided as a reference current signal.

In line with yet another preferred development of the present invention, a potential difference signal which corresponds to a potential difference which is present on the line device is detected by a potential-difference detection unit and is forwarded to the comparison unit. Preferably, the potential-difference detection unit is provided on the line device such that a potential difference which is present on the line device is measured or detected directly. It is also possible to provide the potential-difference detection unit in an external protective device which is connected between the line driver device and the line device.

In line with yet another preferred development of the present invention, a current signal which corresponds to a current flowing in the line device is detected by a current detection unit and is forwarded to the comparison unit. Preferably, the current detection unit is arranged within the amplifier unit. It is also possible to arrange the current detection unit in the line unit.

It is expedient to supply the comparison unit with the reference signal level via a reference signal level input unit. The reference signal level is expediently provided as a reference potential difference signal if overvoltages are to be detected. In addition, it is expedient to provide the reference signal level as a reference current signal if overcurrents in the line device are to be detected.

In line with yet another preferred development of the present invention, the operating mode of the amplifier unit is controlled directly by the control signal which is output by the comparison unit.

Exemplary embodiments of the invention are shown in the drawings and are explained in more detail in the description below.

DETAILED DESCRIPTION

In the figures, identical reference symbols denote components or steps which are the same or have the same function.

Figure 1:
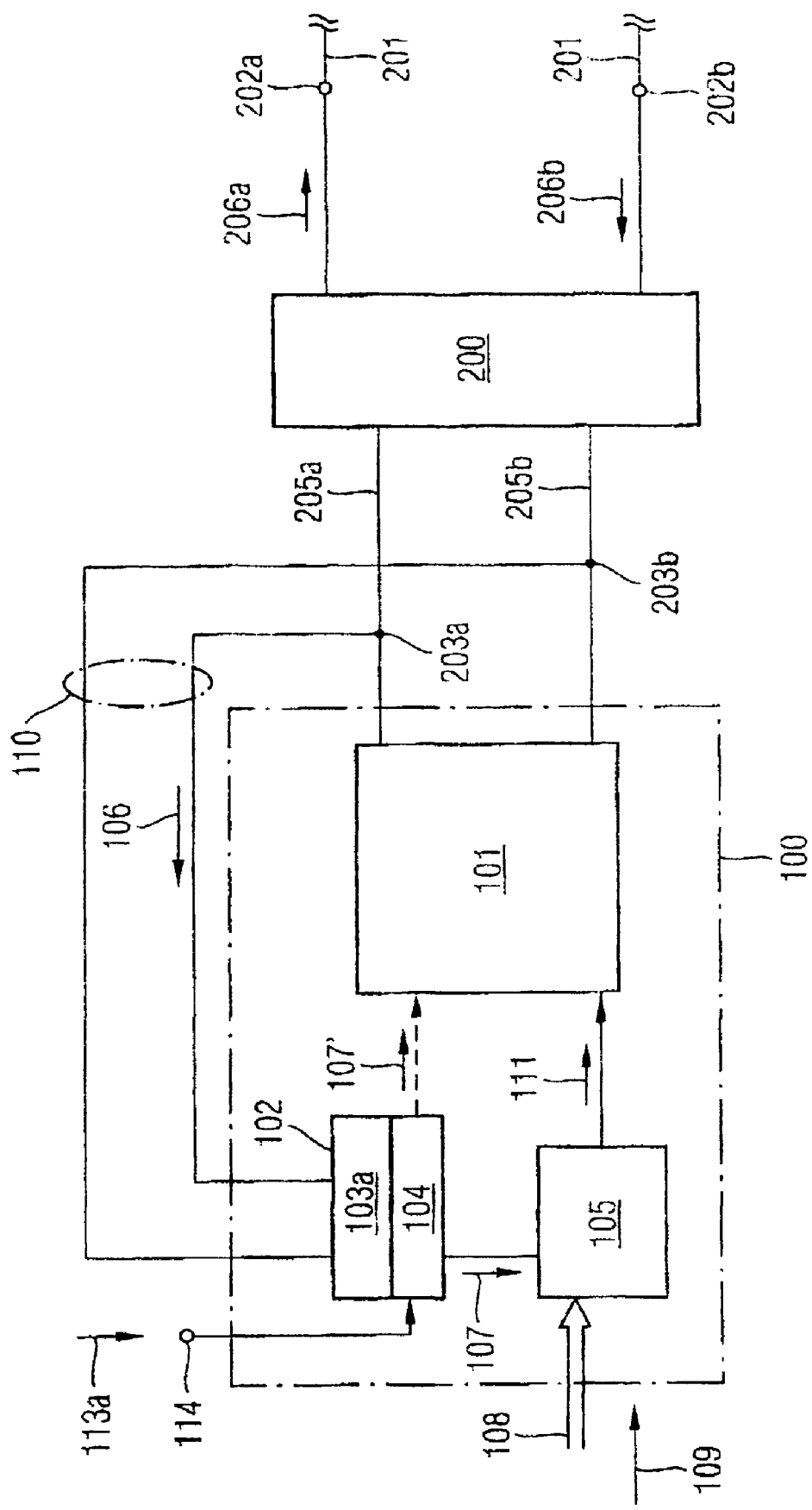
FIG. 1 shows a line driver device with a determination unit for protecting the amplifier unit arranged in the line driver device against overvoltages, in line with a preferred exemplary embodiment of the present invention.

FIG. 1 shows a block diagram of a preferred exemplary embodiment of the inventive transmission apparatus for line signals.

As FIG. 1 shows, a line driver device 100 is connected to a line device 201 via output connections 202a, 202b. Between the line driver device 100 and the output connections 202a, 202b there is an external protective device 200 which is of simplified design in comparison with conventional external protective devices for protecting line driver devices against overvoltages (see FIG. 4). The line driver device 100 is connected to the external protective device 200 via connecting lines 205a, 205b. The line device 201 is used to drive line signals 206a, 206b.

In the inventive line driver device 100, the fundamental components are represented by blocks. In this context, a reference symbol 101 denotes an amplifier unit, 105 denotes the control unit, 102 denotes a determination unit comprising a detection unit 103a and a comparison unit 104, 107 and 107' denote control signals and 111 denotes an operating-mode control signal.

In order to be able to simplify the external protective device 200, the amplifier unit 101 is switched to a safety mode when an overvoltage arises, as illustrated in FIG. 1. Such an operating condition may be a "power down" operating condition, for example, i.e. the amplifier unit 101 is turned off. A further operating condition for the amplifier unit 101 would be "active". By way of example, if there is influencing in an "active" condition, in which the output impedance of the amplifier unit 101 is relatively low, then large currents flow into the entire line driver device 100. By contrast, the output impedance in the "power down" operating condition is very high, which results in only small currents being able to flow into the entire line driver device 100, such that the line driver device 100 is protected against overvoltages and/or overcurrents.

Figure 2:
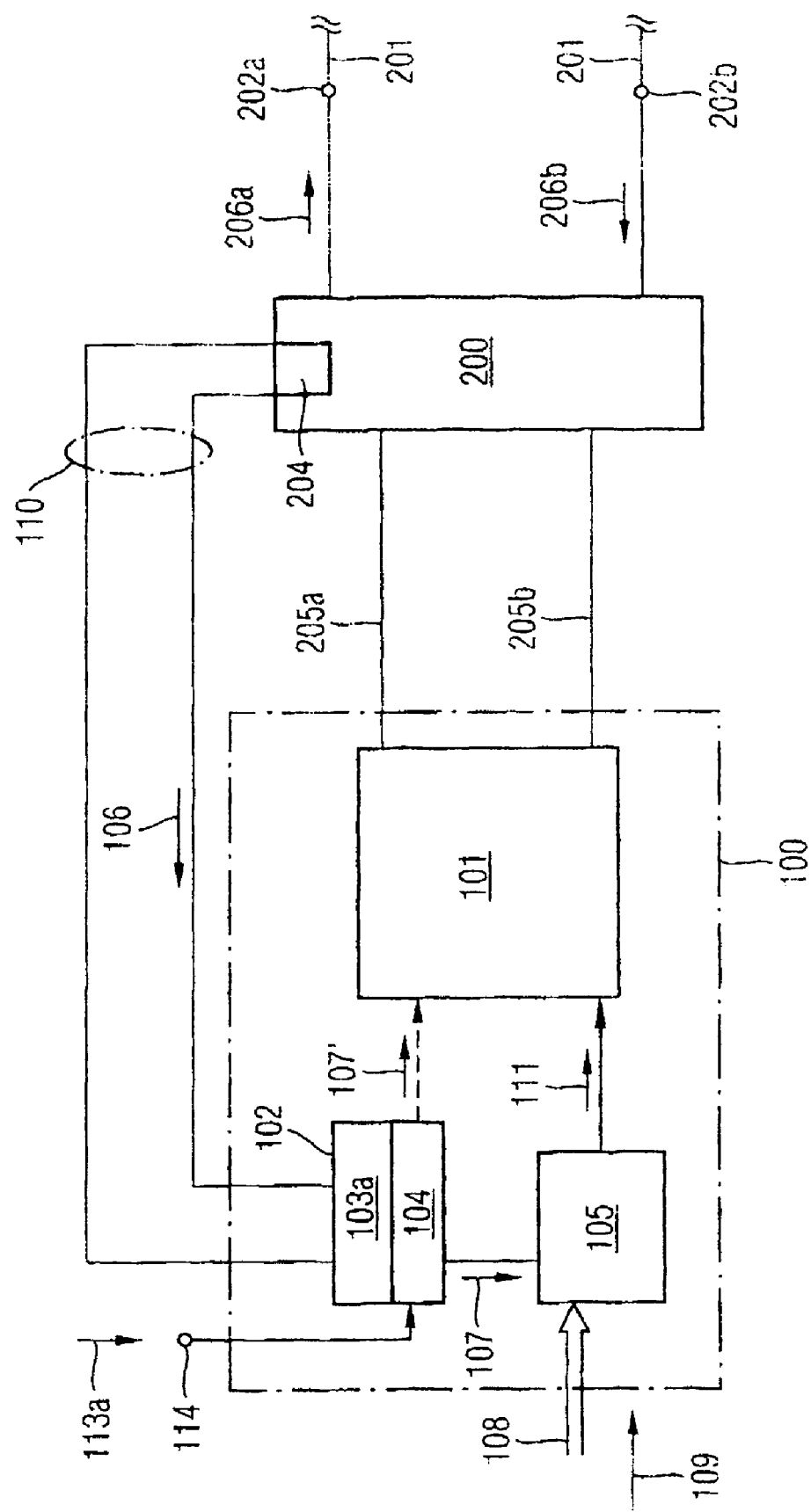
FIG. 2 shows a line driver device with a determination unit for protecting the amplifier unit arranged in the line driver device against overvoltages, in line with a further preferred exemplary embodiment of the present invention.
Figure 3:
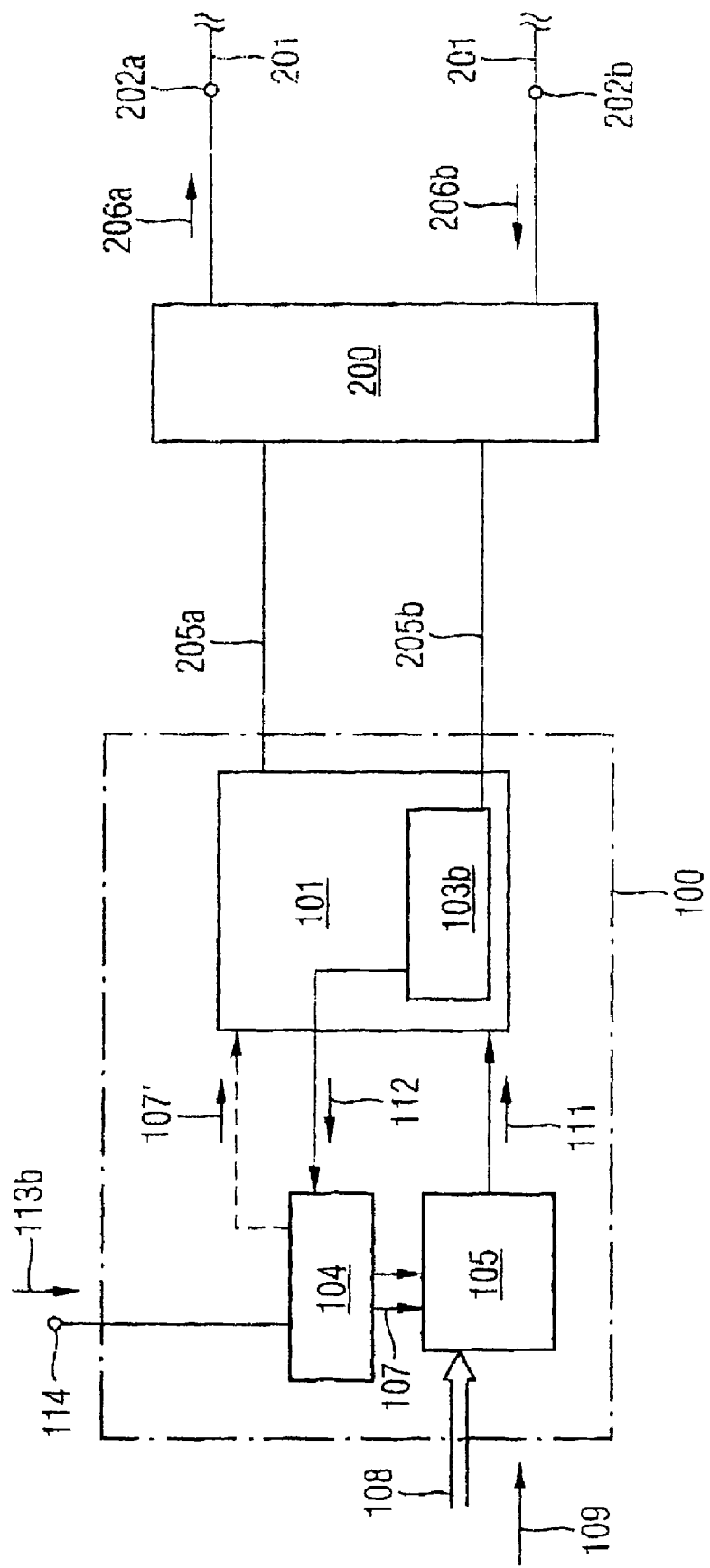
FIG. 3 shows a line driver device for protecting the amplifier unit arranged in the line driver device against overcurrents, in line with yet another preferred exemplary embodiment of the present invention.

FIGS. 1 and 2 illustrate preferred embodiments of the present invention for detecting overvoltages, while FIG. 3 illustrates a preferred embodiment of the present invention for detecting an overcurrent.

As FIG. 1 shows, the detection unit 103a, which is in the form of a potential-difference detection unit, is connected to detection connections 203a and 203b via a detection line 110, said detection connections each being electrically connected to the connecting line 205a, 205b. The potential-difference detection unit 103a is thus supplied with a potential difference signal 106, which corresponds to a potential difference which is present on the line device 201. The potential difference signal 106 which is output by the potential-difference detection unit 103a is supplied directly to the comparison unit 104.

The comparison unit 104 is also supplied with a reference signal level 113a as a reference potential difference signal via a reference signal level detection unit 114. The comparison unit 104 then compares the detected signal level of the line signals 206a, 206b, i.e. the potential difference signal 106, with the reference potential difference signal 113a. If the signal level, i.e. the potential difference signal 106, of the line signals 206a, 206b exceeds the prescribed reference signal level, i.e. the reference potential difference signal 113a, then the amplifier unit 101 is switched to a safe mode. To this end, the comparison unit 104 outputs a control signal 107 to the control unit 105, which can use an operating-mode control signal 111 to change over operating modes for the amplifier unit 101.

It is also possible to control the operating mode of the amplifier unit 101 directly using a control signal 107' which is supplied to the amplifier unit 101 directly from the comparison unit 104.

In addition, the control unit 105 is supplied with a mode control signal 109 via a mode control bus 108, said mode control signal being able to be used to prescribe an operating mode for the amplifier unit 101 externally.

The inventive overvoltage protective apparatus thus makes it possible for a protective mode or a safety mode to be switched by additional components within the line driver device 100. In this way, the advantage is obtained that the external protective device 200 can be simplified. It is also possible for the line driver device 100 to be operated entirely without an external protective device 200 by virtue of the connecting lines 205a and 205b being connected directly to the line device 201.

FIG. 2 shows a block diagram of a further preferred exemplary embodiment of the present invention. In the case of the transmission apparatus shown in FIG. 2, the potential difference signal 106 is derived directly from the external protective device 200, which needs to be present in any case for this reason.

It should be pointed out that components and steps which have already been described with reference to FIG. 1 are not described again here, in order to avoid any overlapping description.

As FIG. 2 shows, the external protective device 200 has a protective device output unit 204 from which, as shown in the example in FIG. 2, it is possible to derive a potential difference signal 106 which corresponds to a potential difference between the two lines of the line device 201. It is also possible to detect a current flowing through the line device 201 using a current detection unit and to supply the corresponding detection signal to the comparison unit 104 (see FIG. 3). The detection line 110 is used to supply the potential-difference detection unit 103a with the potential difference signal 106, whereupon it is processed further, as already described above with reference to FIG. 1.

FIG. 3 shows a further preferred exemplary embodiment in line with the present invention. To detect overcurrents, which may arise in the line device 201 and hence also on the connecting line 205a, 205b, the amplifier unit 101 has a current detection unit 103b. It should be pointed out that the current detection unit 103b may also be arranged outside of the amplifier unit 101, for example in the external protective device 200. A fundamental aspect is that the current detection unit 103b is connected to the comparison unit 104, with the comparison unit 104 now being in the form of a current comparison unit. The comparison unit 104 is supplied with a reference signal level in the form of a reference current signal 113b via a reference signal level input unit 114.

In the comparison unit 104, the reference current signal 113b is compared with the current signal 112 supplied by the current detection unit 103b. When a signal level for the line signals 206a, 206b, i.e. the current signal 112, exceeds the prescribed reference signal level 113b, i.e. the reference current signal 113b, the amplifier unit 101 is switched to an operating mode which ensures that the amplifier unit 101 is insensitive toward the increased line current. By way of example, this operating mode is a safety mode or a "power down" mode.

It should be pointed out that the other components shown in FIG. 3 have already been described with reference to the FIGS. 1 and 2.

By combining the embodiments from FIG. 1 and FIG. 2, on the one hand, and from FIG. 3, on the other, it is possible to provide power detection on the line as a result of the combined overvoltage and overcurrent detection. The amplifier unit 101 is thus switched to a safety mode when a particular power level, determined by the current signal 112 together with the potential difference signal 106, is exceeded.

The potential-difference detection unit 103a and/or the current detection unit 103b may also be designed such that specific rise times in the potential difference signal 106 or the current signal 112 are identified. If specifically prescribable rise times are exceeded by the power signals 206a, 206b, then it is also possible to change over the amplifier unit 101 to a safety mode. The inventive transmission apparatus thus has the advantage that the amplifier unit used in the line driver device 100 can be protected against steady-state overvoltages, steady-state overcurrents, excessively high powers and excessive rise times for voltages and currents.

Figure 4:
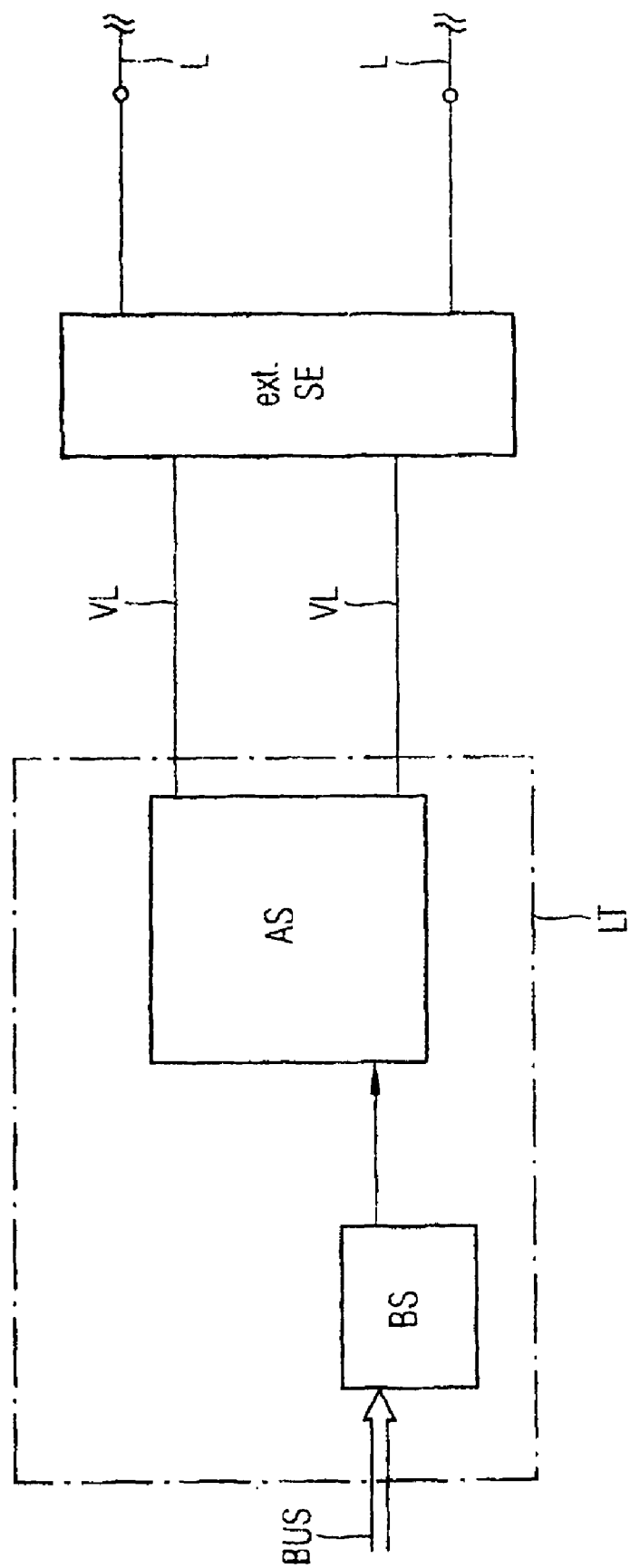
FIG. 4 shows a conventional line driver device with upstream external protective elements.

As regards the conventional transmission apparatus shown in FIG. 4, reference is made to the introduction to the description.

Although the present invention has been described above with reference to preferred exemplary embodiments, it is not limited thereto but rather may be modified in a wide variety of ways.

The invention is also not limited to the application options cited.

LIST OF REFERENCE SYMBOLS

In the figures, identical reference symbols denote components or steps which are the same or have the same function.
100 Line driver device
101 Amplifier unit
102 Determination unit
103a, 103b detection unit
104 Comparison unit
105 Control unit
106 Potential difference signal
107 Control signal
108 Mode control bus
109 Mode control signal
110 Detection line
111 Operating-mode control signal
112 Current signal
113a, 113b reference signal level
114 Reference level input unit
200 External protection device
201 Line device
202a, 202b output connection
203a, 203b detection connection
204 Protection device output unit
205a, 205b connecting line
206a, 206b line signal

The invention claimed is:

1. A transmission apparatus, comprising:
   a) a line device configured to transmit line signals at prescribed signal levels; and
   b) a line driver device, comprising:
      an amplifier unit configured to amplify the line signals such that said amplified line signals are driven onto the line device at the prescribed signal level,
      a control unit configured to control an operating mode of the amplifier unit using an operating-mode control signal,
      a determination unit configured to determine when a prescribed reference signal level is exceeded by a signal level of the line signals and to generate a control signal responsive to said determination, the determination unit operably coupled to provide the control signal to the control unit, wherein the control unit is configured to use the operating-mode control signal to cause the amplifier unit to change to a different operating mode responsive to receiving the control signal, wherein the line driver device is a subscriber line interface circuit, wherein the line driver device is arranged in the apparatus such that it is protected against overvoltages and overcurrents, wherein the line driver device includes a mode control bus configured to supply an externally-generated mode control signal to the control unit, and wherein the control unit is further configured to generate the operating-mode control signal based on the externally-generated mode control signal.

2. The apparatus as claimed in claim 1, wherein the determination unit includes a detection unit configured to detect the signal level of the line signals.

3. The apparatus as claimed in claim 2, wherein the determination unit further comprises a comparison unit configured to compare the detected signal level of the line signals with the prescribed reference signal level.

4. The apparatus as claimed in claim 2, wherein the detection unit is configured to detect a potential difference which is present on the line device.

5. The apparatus as claimed in claim 2, wherein the detection unit is configured to detect a current signal which corresponds to a current flowing in the line device.

6. A method for transmitting line signals via a line device operably connected to a subscriber line interface circuit, the subscriber line interface circuit including at least a control unit, an amplifier unit, a detection unit and a comparison unit, the method comprising:
 a) controlling the amplifier unit by means of the control unit to operate in an operating mode using an operating-mode control signal;
 b) amplifying by means of the amplifier the line signals to be transmitted to a prescribable signal level using the amplifier unit on the basis of the operating mode;
 c) providing the line signals to be transmitted onto the line device;
 d) detecting the signal level of the line signals by means of the detection unit;
 e) automatically comparing the detected signal level of the line signals by means of the comparison unit with a reference signal level, said comparison being made against the reference signal level, the reference signal level comprising a reference current signal;
 f) generating a control signal based on the comparing of the detected signal level of the line signals with the reference signal level, the control signal provided to the control unit;
 g) automatically and selectively switching the amplifier unit by means of the operating-mode control signal to a safety operating mode based on results of the comparison;
 h) supplying an externally-generated mode control signal to the control unit; and
 i) generating the operating-mode control signal based on the externally generated mode control signal.

7. The method as claimed in claim 6, wherein step f) further comprises switching the amplifier unit to the safety operating mode by turning off the amplifier unit.

8. The method as claimed in claim 6, wherein step e) further comprises automatically comparing the detected signal level of the line signals with the reference signal level, the reference signal comprising a reference potential difference.

9. The method as claimed in claim 6, wherein step d) further comprises detecting a potential difference which is present on the line device.

10. The method as claimed in claim 6, wherein step d) further comprises detecting a current flowing in the line device.

11. The method as claimed in claim 6, further comprising supplying a reference potential difference signal as the reference signal level for comparison.

12. The method as claimed in claim 6, wherein: step e) further comprises using a comparison unit to compare the detected signal level of the line signals with a reference signal level; and step f) further comprises automatically and selectively switching the amplifier unit to a safety operating mode based on results of the comparison, by generating a control signal in the comparison unit if the detected signal level exceeds the reference signal level.

* * * * *